(12) United States Patent
Liang et al.

(10) Patent No.: US 12,074,520 B2
(45) Date of Patent: Aug. 27, 2024

(54) SMART POWER STAGE MODULE, CURRENT MONITORING SIGNAL GENERATION CIRCUIT AND METHOD THEREOF

(71) Applicant: uPI semiconductor corp., Zhubei (TW)

(72) Inventors: Yow-Tsyr Liang, Zhubei (TW); Heng-Li Lin, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 221 days.

(21) Appl. No.: 17/812,470

(22) Filed: Jul. 14, 2022

(65) Prior Publication Data

US 2023/0055903 A1 Feb. 23, 2023

(30) Foreign Application Priority Data

Aug. 19, 2021 (CN) .......................... 202110953744.5

(51) Int. Cl.
| | |
|---|---|
| *H02M 3/158* | (2006.01) |
| *G01R 19/00* | (2006.01) |
| *H02M 1/00* | (2006.01) |
| *H02M 3/157* | (2006.01) |

(52) U.S. Cl.
CPC ........ *H02M 3/158* (2013.01); *G01R 19/0092* (2013.01); *H02M 1/0009* (2021.05); *H02M 1/0032* (2021.05); *H02M 3/157* (2013.01)

(58) Field of Classification Search
CPC ............ G01R 19/0092; H02M 1/0009; H02M 1/0032; H02M 3/157
See application file for complete search history.

(56) References Cited

U.S. PATENT DOCUMENTS

| | | | | |
|---|---|---|---|---|
| 7,880,455 | B2 * | 2/2011 | Wu .......................... | H02M 1/32 323/284 |
| 9,065,337 | B2 * | 6/2015 | Tanabe .................. | H02M 3/156 |
| 9,184,651 | B2 * | 11/2015 | Nguyen ............. | G01R 19/0092 |
| 9,812,963 | B1 | 11/2017 | Nguyen et al. | |
| 9,853,548 | B1 * | 12/2017 | Zhang ..................... | H02M 1/08 |
| 10,116,212 | B2 | 10/2018 | Luo et al. | |
| 11,283,355 | B2 * | 3/2022 | Ke ......................... | H02M 3/158 |

(Continued)

*Primary Examiner* — Yusef A Ahmed
(74) *Attorney, Agent, or Firm* — McClure, Qualey & Rodack, LLP

(57) ABSTRACT

A smart power stage module includes an output stage and a driving circuit. The output stage includes a low-side switch and provides an output current. The driving circuit controls an operation of the output stage according to a PWM signal. The driving circuit includes a determination circuit generating a control signal according to the PWM signal and a signal combination circuit providing a current monitoring signal representing the output current. The current monitoring signal is a combination of a simulated current signal and an actual sensed current signal. The signal combination circuit includes a switching circuit switching according to the control signal to adjust a proportion of simulated current signal and actual sensed current signal. When the on-time period part of low-side switch is shorter than a default time period, the switching circuit shortens duration of simulated current signal in the current monitoring signal according to the control signal.

8 Claims, 8 Drawing Sheets

(56) References Cited

U.S. PATENT DOCUMENTS

| | | | | |
|---|---|---|---|---|
| 2006/0125454 | A1* | 6/2006 | Chen | H02M 3/1588 |
| | | | | 323/282 |
| 2008/0278123 | A1* | 11/2008 | Mehas | H02M 3/1588 |
| | | | | 323/266 |
| 2015/0177756 | A1* | 6/2015 | Yuan | G05F 1/56 |
| | | | | 323/280 |
| 2015/0222171 | A1* | 8/2015 | Nguyen | H02M 1/08 |
| | | | | 323/282 |
| 2015/0280567 | A1* | 10/2015 | Fukumoto | H02M 3/156 |
| | | | | 323/271 |
| 2015/0303790 | A1* | 10/2015 | Lin | H02M 1/4225 |
| | | | | 363/89 |
| 2017/0060213 | A1* | 3/2017 | Wu | G06F 1/26 |
| 2018/0054134 | A1* | 2/2018 | Moon | H02M 1/08 |
| 2021/0006159 | A1* | 1/2021 | Ke | H02M 3/158 |
| 2021/0050782 | A1* | 2/2021 | Bandyopadhyay | |
| | | | | H03K 17/0822 |
| 2021/0159796 | A1* | 5/2021 | Lee | H02M 3/158 |
| 2022/0407415 | A1* | 12/2022 | Bean, Jr. | H02M 3/155 |
| 2023/0194577 | A1* | 6/2023 | Xue | H02M 1/0009 |
| | | | | 324/76.11 |
| 2023/0308018 | A1* | 9/2023 | Chang | H02M 3/156 |
| 2024/0030811 | A1* | 1/2024 | D'Souza | H02M 1/0009 |
| 2024/0113609 | A1* | 4/2024 | Domingo | H02M 1/0003 |

* cited by examiner

SMART POWER STAGE MODULE, CURRENT MONITORING SIGNAL GENERATION CIRCUIT AND METHOD THEREOF

BACKGROUND OF THE INVENTION

1. Field of the Invention

The invention relates to current monitoring; in particular, to a smart power stage module, a current monitoring signal generation circuit and a current monitoring signal generation method.

2. Description of the Prior Art

The conventional current sensing circuit usually uses an operational amplifier to directly sense an inductor current of a power converter, but it is only suitable for the condition that the on-time period of the switch is long. With the increase of the switching frequency of the power conversion system, no matter a buck converter or a boost converter, it is possible that the on-time period of the switch is too short for the conventional current sensing circuit to obtain a real-time current waveform.

As shown in FIG. 1, taking a buck converter as an example, in the prior art, a part of a simulated current signal CS2 is used to represent a rising waveform of an actual output current, and then an actual sensed current signal CS1 and the simulated current signal CS2 are combined into a complete waveform of a current monitor signal IMON. Switching between the simulated current signal CS2 and the actual sensed current signal CS1 needs a buffer time period BT (for example, 400 ns from the time that the current monitoring signal IMON starts falling) for performing actions such as control signal transmission, control circuit response and calibration of the current monitoring signal IMON. And, when the buffer time period BT ends, the simulated current signal CS2 is switched to the actual sensed current signal CS1.

However, when the converter system is in a transient state, it is likely that the switching period of the switch in the output stage is shortened (that is to say, the switching frequency of the switch is increased) and shorter than the buffer time period BT, so that the actual sensed current signal CS1 cannot be used to calibrate the waveform of the current monitoring signal IMON. As shown in FIG. 2, especially when the transient state lasts for several switching periods, the error between the current monitoring signal IMON obtained by the prior art and the actual output current IL continues to accumulate, which seriously affects the accuracy of the current monitoring signal IMON. This problem needs to be improved.

SUMMARY OF THE INVENTION

Therefore, the invention provides a smart power stage module, a current monitoring signal generation circuit and a current monitoring signal generation method to solve the above-mentioned problems of the prior arts.

An embodiment of the invention is a smart power stage module. In this embodiment, the smart power stage module includes an output stage and a driving circuit. The output stage includes a low-side switch and configured to provide an output current. The driving circuit is coupled to the output stage and configured to control an operation of the output stage according to a pulse-width modulation (PWM) signal. The PWM signal includes an on-time period part of the low-side switch. The driving circuit includes a determination circuit and a signal combination circuit. The determination circuit is configured to generate a control signal according to the PWM signal. The signal combination circuit is coupled to the determination circuit and the output stage and configured to provide a current monitoring signal representing the output current. The current monitoring signal is a combination of a simulated current signal and an actual sensed current signal. The signal combination circuit includes a switching circuit switching according to the control signal to adjust a proportion of the simulated current signal and the actual sensed current signal. When the on-time period part of the low-side switch is shorter than a default time period, the switching circuit shortens a duration of the simulated current signal in the current monitoring signal according to the control signal.

In an embodiment, the signal combination circuit includes a current sensing circuit and a simulated current generation circuit. The current sensing circuit is coupled to the output stage and the switching circuit and configured to sense the output current to provide the actual sensed current signal. The simulated current generation circuit is coupled to the switching circuit and configured to provide the simulated current signal related to the output current.

In an embodiment, the signal combination circuit further includes a calibration circuit coupled to the current sensing circuit and the simulated current generation circuit respectively and configured to generate a calibration signal according to a difference between the actual sensed current signal and the simulated current signal to make the simulated current generation circuit to generate a calibrated simulated current signal.

In an embodiment, the determination circuit includes a first sampling circuit, a second sampling circuit and a timing control circuit. The first sampling circuit is configured to receive the PWM signal and sample the PWM signal at a first time period counted from a falling edge of the PWM signal to obtain a first sampling result. The second sampling circuit is configured to sample the PWM signal at a second time period counted from the falling edge of the PWM signal to obtain a second sampling result. The second time period is shorter than the first time period. The timing control circuit is coupled to the first sampling circuit and the second sampling circuit respectively and configured to generate the control signal according to the first sampling result and the second sampling result.

In an embodiment, the determination circuit send the control signal to control the switching circuit to make the duration of the simulated current signal in the current monitoring signal being a third time period when the on-time period part of the low-side switch longer or equal to the default time period.

In an embodiment, the determination circuit send the control signal to control the switching circuit to make the duration of the simulated current signal in the current monitoring signal being a fourth time period when the on-time period part of the low-side switch shorter than the default time period. The fourth time period is shorter than the third time period.

Another embodiment of the invention is a current monitoring signal generation circuit. In this embodiment, the current monitoring signal generation circuit is coupled to an output stage of the smart power stage module. The output stage includes a low-side switch and provides an output current according to a PWM signal. The PWM signal includes an on-time period part of the low-side switch. The current monitoring signal generation circuit includes a determination circuit and a signal combination circuit. The determination circuit is configured to generate a control signal according to the PWM signal. The signal combination circuit is coupled to the determination circuit and the output stage and configured to provide a current monitoring signal representing the output current. The current monitoring signal is a combination of a simulated current signal and an actual sensed current signal. The signal combination circuit includes a switching circuit switching according to the control signal to adjust a proportion of the simulated current signal and the actual sensed current signal. When the on-time period part of the low-side switch is shorter than a default time period, the switching circuit shortens a duration of the simulated current signal in the current monitoring signal according to the control signal.

In an embodiment, the signal combination circuit includes a current sensing circuit and a simulated current generation circuit. The current sensing circuit is coupled to the output stage and the switching circuit and configured to sense the output current to provide the actual sensed current signal. The simulated current generation circuit is coupled to the switching circuit and configured to provide the simulated current signal related to the output current.

In an embodiment, the signal combination circuit also includes a calibration circuit. The calibration circuit is coupled to the current sensing circuit and the simulated current generation circuit respectively. The calibration circuit generates a calibration signal according to a difference between the actual sensed current signal and the simulated current signal to make the simulated current generation circuit to generate a calibrated simulated current signal.

Another embodiment of the invention is a current monitoring signal generation method. In this embodiment, this method is applied to a smart power stage module. The smart power stage module includes an output stage. The output stage includes a low-side switch and provides an output current according to a PWM signal. The PWM signal includes an on-time period part of the low-side switch. The method includes: (a) generating a control signal according to the PWM signal; (b) combining a simulated current signal and an actual sensed current signal to provide a current monitoring signal representing the output current; and (c) adjusting a proportion of the simulated current signal and the actual sensed current signal according to the control signal. When the on-time period part of the low-side switch is shorter than a default time period, the step (c) shortens a duration of the simulated current signal in the current monitoring signal according to the control signal.

In an embodiment, the step (b) further includes: (b1) calibrating the simulated current signal according to a difference between the actual sensed current signal and the simulated current signal to generate a calibrated simulated current signal.

In an embodiment, the step (a) further includes: (a1) sampling the PWM signal at a first time period counted from a falling edge of the PWM signal to obtain a first sampling result; (a2) sampling the PWM signal at a second time period counted from the falling edge of the PWM signal to obtain a second sampling result, and the second time period is shorter than the first time period; and (a3) generating the control signal according to the first sampling result and the second sampling result.

In an embodiment, the step (c) makes the duration of the simulated current signal in the current monitoring signal being a third time period according the control signal when the on-time period part of the low-side switch longer or equal to the default time period.

In an embodiment, the step (c) makes the duration of the simulated current signal in the current monitoring signal being a fourth time period according the control signal when the on-time period part of the low-side switch shorter than the default time period. The fourth time period is shorter than the third time period.

Compared to the prior art, the smart power stage module, the current monitoring signal generation circuit and the current monitoring signal generation method of the invention dynamically adjust the time period point of switching the simulated current signal and the actual sensed current signal according to the frequency change of the PWM signal to adjust the proportion of the simulated current signal and the actual sensed current signal in the current monitoring signal, so that the error between the current monitoring signal and the output current represented by the current monitoring signal will not accumulate as the transient state continues, and the accuracy of the current monitoring signal under high-speed switching state can be effectively improved.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
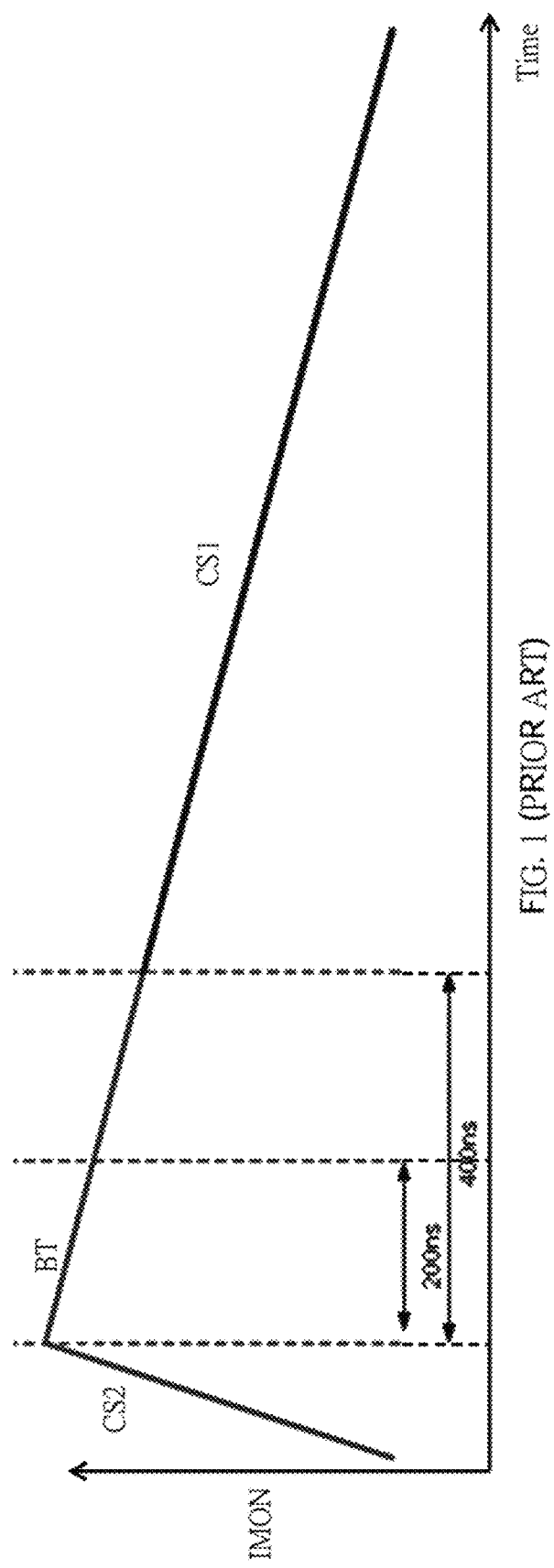
FIG. 1 illustrates a schematic diagram of the conventional buck converter combining the simulated current signal and the sensed current signal into a complete waveform of the current monitoring signal.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

An embodiment of the invention is a smart power stage (SPS) module. In this embodiment, the SPS module can be applied to different types of voltage conversion circuits, such as, but not limited to, a buck converter circuit or a boost converter circuit.

Figure 3:
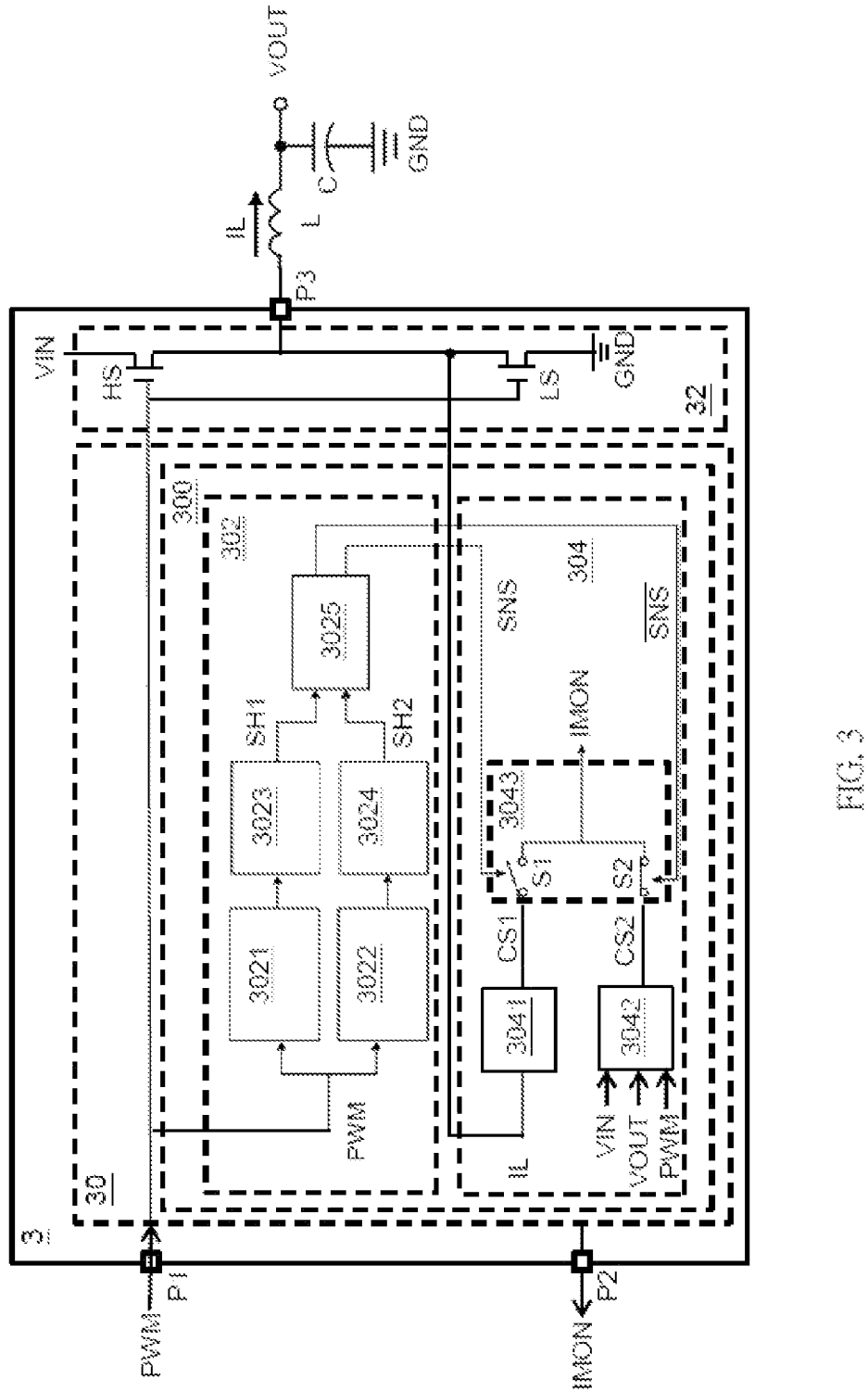
FIG. 3 illustrates a schematic diagram of the smart power stage module in an embodiment of the invention.

Please refer to FIG. 3. FIG. 3 illustrates a schematic diagram of the SPS module in this embodiment. As shown in FIG. 3, the SPS module 3 includes a driving circuit 30 and an output stage 32 coupled to each other. The output stage 32 includes a high-side switch HS and a low-side switch LS coupled in series between an input voltage VIN and a ground terminal GND. One terminal of an output inductor L is coupled between the high-side switch HS and the low-side switch LS. The control terminals (gates) of the high-side switch HS and the low-side switch LS both receive a pulse-width modulation signal PWM, and the operations of the high-side switch HS and the low-side switch LS are both controlled by the pulse-width modulation signal PWM. In an embodiment, the driving circuit 30 performs some signal processing on the pulse-width modulation signal PWM, such as level-shifting. The pulse-width modulation signal PWM includes the on-time period parts of the high-side switch HS and the low-side switch LS. An output capacitor C is coupled between the other terminal of the output inductor L and the ground terminal GND. The output stage 32 provides an output current IL to flow through the output inductor L to generate an output voltage VOUT at the other terminal of the output inductor L. The SPS module 3 further includes pins P1~P3. The pin P1 is used for receiving the pulse-width modulation signal PWM, the pin P2 is used for providing a current monitoring signal IMON, and the pin P3 is used for providing the output current IL.

The driving circuit 30 includes a determination circuit 302 and a signal combination circuit 304. The determination circuit 302 is coupled to the signal combination circuit 304 for generating the control signal SNS/$\overline{\text{SNS}}$ to the signal combination circuit 304 according to the pulse-width modulation signal PWM. The signal combination circuit 304 is coupled to the determination circuit 302 and the output stage 32 for receiving the control signal SNS/$\overline{\text{SNS}}$ and the output current IL and providing the current monitoring signal IMON representing the output current IL. The current monitoring signal IMON is a combination of an actual sensed current signal CS1 and a simulated current signal CS2.

In this embodiment, the determination circuit 302 includes a first sampling circuit 3021, a second sampling circuit 3022, a first noise-filtering circuit 3023, a second noise-filtering circuit 3024 and a timing control circuit 3025. The first sampling circuit 3021 is coupled to the first noise-filtering circuit 3023. The second sampling circuit 3022 is coupled to the second noise-filtering circuit 3024. The first noise-filtering circuit 3023 and the second noise-filtering circuit 3024 are both coupled to the timing control circuit 3025. The timing control circuit 3025 is coupled to the signal combination circuit 304. In fact, the first noise-filtering circuit 3023 and the second noise-filtering circuit 3024 can be a filter, a D-flip flop or a register, but not limited to this.

The first sampling circuit 3021 receives the pulse-width modulation signal PWM and samples the pulse-width modulation signal PWM at a first time period counted from a falling edge of the pulse-width modulation signal PWM, and then filtered by the first noise-filtering circuit 3023 to obtain a first sampling result SH1. The second sampling circuit 3022 receives the pulse-width modulation signal PWM and samples the pulse-width modulation signal PWM at a second time period counted from the falling edge of the pulse-width modulation signal PWM, and then filtered by the second noise-filtering circuit 3024 to obtain a second sampling result SH2, and the second time period is shorter than the first time period. The timing control circuit 3025 generates the control signal SNS/$\overline{\text{SNS}}$ to the signal combination circuit 304 according to the first sampling result SH1 and the second sampling result SH2.

In this embodiment, the signal combination circuit 304 includes a current sensing circuit 3041, a simulated current generation circuit 3042 and a switching circuit 3043. The current sensing circuit 3041 is coupled to the output stage 32 and the switching circuit 3043 for sensing the output current IL to provide the actual sensed current signal CS1. The simulated current generation circuit 3042 is coupled to the switching circuit 3043 for providing the simulated current signal CS2 related to the output current IL according to the input voltage VIN, the output voltage VOUT and the pulse-width modulation signal PWM.

Since the current monitoring signal IMON provided by the signal combination circuit 304 is a combination of the actual sensed current signal CS1 and the simulated current signal CS2, the switching circuit 3043 switches according to the control signal SNS/$\overline{\text{SNS}}$ to adjust a proportion of the actual sensed current signal CS1 and the simulated current signal CS2 in the current monitoring signal IMON.

In practical applications, the switching circuit 3043 includes a switch S1 and a switch S2. One terminal of the switch S1 is coupled to the current sensing circuit 3041. One terminal of the switch S2 is coupled to the simulated current generation circuit 3042. The other terminal of the switch S1 and the other terminal of the switch S2 are coupled to each other. The operations of the switch S1 and the switch S2 are respectively controlled by the control signals SNS and $\overline{\text{SNS}}$ which are in opposite phases to each other.

In this embodiment, when the on-time period part of the low-side switch LS in the pulse-width modulation signal PWM (that is to say, the duration of the low-level state of the pulse-width modulation signal PWM) is shorter than a default time period, the switching circuit 3043 will shorten the duration of the simulated current signal CS2 in the current monitoring signal IMON according to the control signals SNS and $\overline{\text{SNS}}$. In other words, when the switching frequency of the high-side switch HS and the low-side switch LS controlled by the pulse-width modulation signal PWM becomes faster, the switching circuit 3043 switches according to the control signal SNS/$\overline{\text{SNS}}$, so that the current monitoring signal IMON switches from the simulated current signal CS2 to the actual sensed current signal CS1 earlier to reduce the proportion of the simulated current signal CS2 in the current monitoring signal IMON.

For example, assuming that the default time period is 400 ns, when the on-time period part of the low-side switch LS of the pulse-width modulation signal PWM is greater than or equal to 400 ns, it means that there is still the actual sensed current signal CS1 in the current monitoring signal IMON. The determination circuit 302 sends the control signal SNS/$\overline{\text{SNS}}$ to control the switching of the switching circuit 3043, so that the simulated current signal CS2 in the current monitoring signal IMON lasts for a long period of time period (for example, 400 ns) before switching to the actual sensed current signal CS1. When the on-time period part of the low-side switch LS of the pulse-width modulation signal PWM is shorter than 400 ns, the determination circuit 302 sends out the control signal SNS/$\overline{\text{SNS}}$ to control the switching of the switching circuit 3043 to make the simulated current signal CS2 in the current monitoring signal IMON continue for a short period of time period (for example, 200 ns) before switching to the actual sensed current signal CS1.

Figure 4:
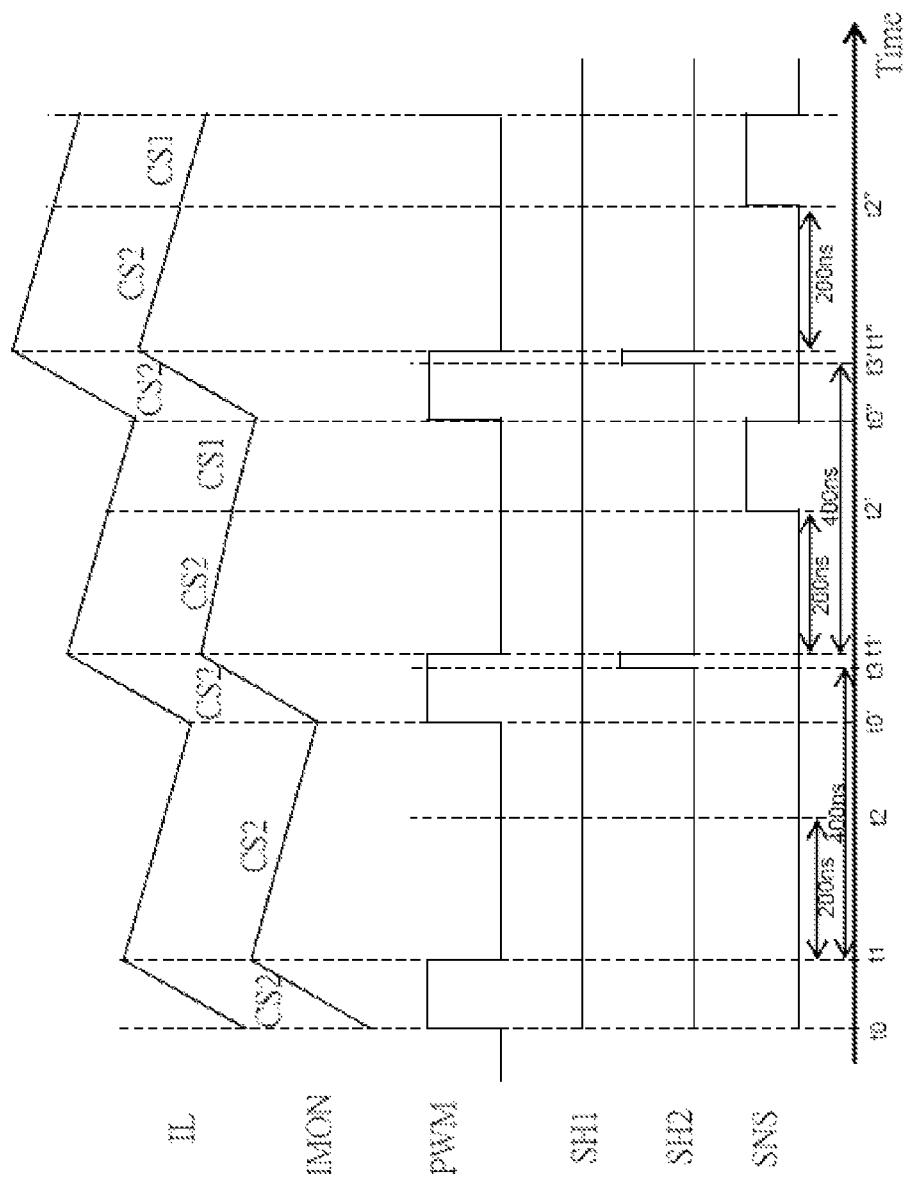
FIG. 4 illustrates timing diagrams of the signal waveforms when the on-time period part of the lower-side switch in the PWM signal of the invention is between 200 ns and 400 ns.

Please refer to FIG. 4. FIG. 4 illustrates timing diagrams of the signal waveforms when the on-time period part of the low-side switch LS in the pulse-width modulation signal PWM of the invention is between 200 ns and 400 ns. As shown in FIG. 4, when the on-time period part of the low-side switch LS in the pulse-width modulation signal PWM (that is to say, the duration of the low-level state of the pulse-width modulation signal PWM) is between 200 ns and 400 ns, since it is shorter than the default time period 400 ns, which means that the switching speed of the high-side switch HS and the low-side switch LS in the output stage 32 is too fast, errors may be occurred in the simulated current signal CS2 to cause the current monitoring signal IMON to deviate from the output current IL. Therefore, the determination circuit 302 sends the control signal SNS/$\overline{SNS}$ to control the switching of the switching circuit 3043, so that the current monitoring signal IMON is switched from the simulated current signal CS2 to the actual sensed current signal CS1 earlier.

In detail, in a first period (from the time t0 to the time t0'), the pulse-width modulation signal PWM is at high-level during the period from the time t0 to the time t1, which corresponds to the on-time period part of the high-side switch HS, so the high-side switch HS in the output stage 32 is controlled to be turned on. At the time t0, the timing control circuit 3025 in the determination circuit 302 is reset by a rising edge of the pulse-width modulation signal PWM. At the time t1, the first sampling circuit 3021, the second sampling circuit 3022 and the timing control circuit 3025 are triggered by a falling edge of the pulse-width modulation signal PWM to start timing. At the time t2, the first sampling circuit 3021 samples the pulse-width modulation signal PWM to obtain a first sampling result SH1=0 (that is to say, the pulse-width modulation signal PWM is at low-level, which corresponds to the on-time period part of the low-side switch LS). At the time t0', the first period ends and the second period (from the time t0' to the time t0'') starts, the timing control circuit 3025 in the determination circuit 302 is reset by the rising edge of the pulse-width modulation signal PWM. In the first period, since the control signal SNS is maintained at low-level, when the first period ends, the switching time from the simulated current signal CS2 to the actual sensed current signal CS1 has not been reached, so the current monitoring signal outputted by the signal combination circuit 304 IMON is the simulated current signal CS2.

At the time t3, since the time counted from the falling edge (i.e., the time t1) of the pulse-width modulation signal PWM in the first period has reached 400 ns, the second sampling circuit 3022 samples the pulse-width modulation signal to obtain a second sampling result SH2=1 (that is to say, the pulse-width modulation signal PWM is at high-level). The timing control circuit 3025 shortens the switching time for switching from the simulated current signal CS2 to the actual sensed current signal CS1 in the second period (from the time t0' to the time t0'') to 200 ns counted from the falling edge of the pulse-width modulation signal PWM.

At the time t1', the first sampling circuit 3021, the second sampling circuit 3022 and the timing control circuit 3025 are triggered by the falling edge of the pulse-width modulation signal PWM to start timing. At the time t2', the first sampling circuit 3021 samples the pulse-width modulation signal PWM to obtain the first sampling result SH1=0 (that is to say, the pulse-width modulation signal PWM is at low-level). At this time, the control signal SNS outputted by the timing control circuit 3025 changes from original low-level to high-level, so that the current monitoring signal IMON is switched from the original simulated current signal CS2 to the actual sensed current signal CS1. At the time t0'', the second period ends, and the control signal SNS is reset to low-level, so that the current monitoring signal IMON is switched to the simulated current signal CS2 again. At this time, an initial value of the simulated current signal CS2 is an end value of the actual sensed current signal, which is a calibrated waveform value. At the time t3', the second sampling circuit 3022 samples the pulse-width modulation signal PWM to obtain the second sampling result SH2=1 (that is to say, the pulse-width modulation signal PWM is at high-level). The timing control circuit 3025 maintains the switching time period for switching from the simulated current signal CS2 to the actual sensed current signal CS1 being 200 ns counted from the falling edge of the pulse-width modulation signal PWM according to the first sampling result SH1=0 and the second sampling result SH2=1.

Next, the situation at the time t1'' is the same as the aforementioned, so it is not described in detail. This state continues until the first sampling result SH1 and the second sampling result SH2 are both 0 (please refer to FIG. 5), the switching time period for switching from the simulated current signal CS2 to the actual sensed current signal CS1 will change from 200 ns counted from the falling edge of the pulse-width modulation signal PWM to 400 ns counted from the falling edge of the pulse-width modulation signal PWM.

Figure 5:
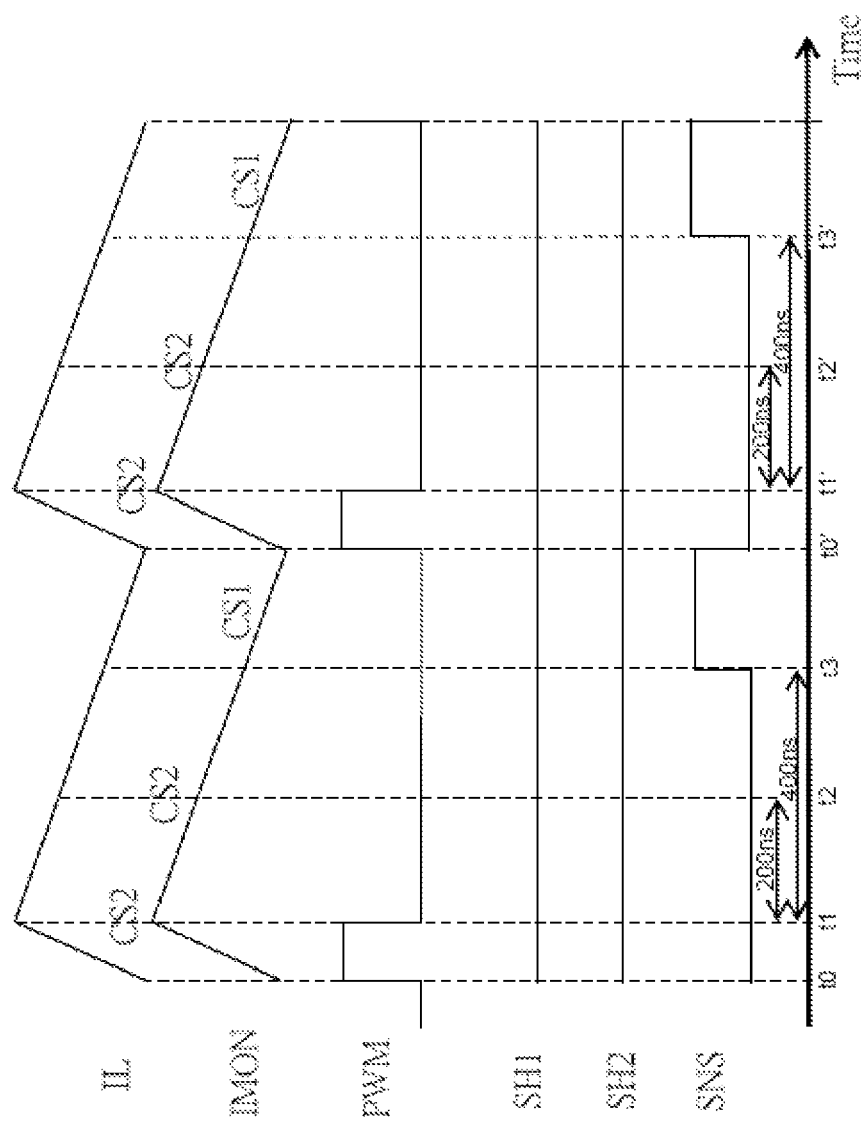
FIG. 5 illustrates timing diagrams of the signal waveforms when the on-time period part of the lower-side switch in the PWM signal of the invention is greater than 400 ns.

Please refer to FIG. 5. FIG. 5 illustrates timing diagrams of the signal waveforms when the on-time period part of the lower-side switch LS in the pulse-width modulation signal of the invention is greater than 400 ns. As shown in FIG. 5, since the on-time period part of the low-side switch LS in the pulse-width modulation signal PWM (that is to say, the duration of the low-level state of the pulse-width modulation signal PWM) is greater than the default time period 400 ns, it represents that the switching speed of the high-side switch HS and the low-side switch LS is relatively slow. Therefore, the determination circuit 302 will send the control signal SNS/$\overline{SNS}$ to control the switching in the switching circuit 3043, so that the current monitoring signal IMON switches from the simulated current signal CS2 to the actual sensed current signal CS1 later.

In detail, in the first period (from the time t0 to the time t0'), the pulse-width modulation signal PWM is at high-level during the period from the time t0 to the time t1, which represents the on-time period part of the high-side switch HS, so the high-side switch HS in the output stage 32 is controlled to be turned on. At the time t0, the timing control circuit 3025 in the determination circuit 302 is reset by the rising edge of the pulse-width modulation signal PWM. At the time t1, the first sampling circuit 3021, the second sampling circuit 3022 and the timing control circuit 3025 are triggered by the falling edge of the pulse-width modulation signal PWM to start timing. At the time t2, the first sampling circuit 3021 samples the pulse-width modulation signal PWM to obtain the first sampling result SH1=0 (that is to say, the pulse-width modulation signal PWM is at low-level). At the time t3, the second sampling circuit 3022 samples the pulse-width modulation signal PWM to obtain the second sampling result SH2=0. The timing control circuit 3025 controls the switching time for switching from the simulated current signal CS2 to the actual sensed current signal CS1 in the second period to be 400 ns counted from the falling edge of the pulse-width modulation signal PWM according to the first sampling result SH1=0 and the second sampling result SH2=0.

It should be noted that when the on-time period part of the low-side switch LS in the PWM signal is shorter than 200 ns (that is to say, the switching frequency of the high-side switch HS and the low-side switch LS in the output stage 32 is greater than 5 MHz), since the actual sensed current signal CS1 cannot be sensed either, and the simulated current signal CS2 can only be used as the waveform of the current monitoring signal IMON, it is not within the scope of the invention.

Figure 6:
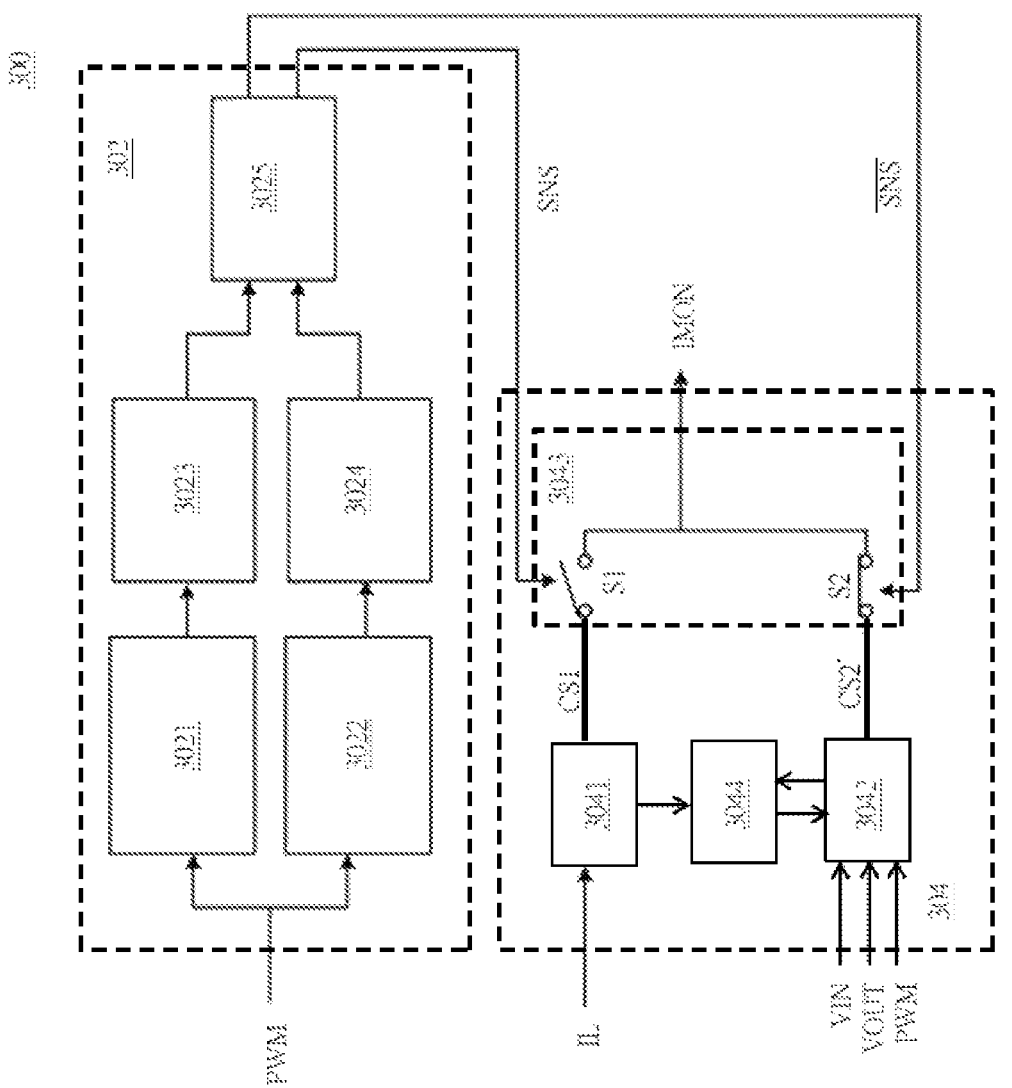
FIG. 6 illustrates a schematic diagram of the signal combination circuit including calibration circuit.

Please refer to FIG. 6. FIG. 6 illustrates a schematic diagram of the signal combination circuit 304 including a calibration circuit 3044. As shown in FIG. 6, in addition to a current sensing circuit 3041, a simulated current generation circuit 3042 and a switching circuit 3043, the signal combination circuit 304 can further include a calibration circuit 3044. The calibration circuit 3044 is coupled to the current sensing circuit 3041 and the simulated current generation circuit 3042 respectively, and is used for generating a calibration signal CAL according to a difference between the actual sensed current signal CS1 and the simulated current signal CS2, so that the simulated current generation circuit 3042 can generate the calibrated simulated current signal CS2' accordingly.

Figure 7:
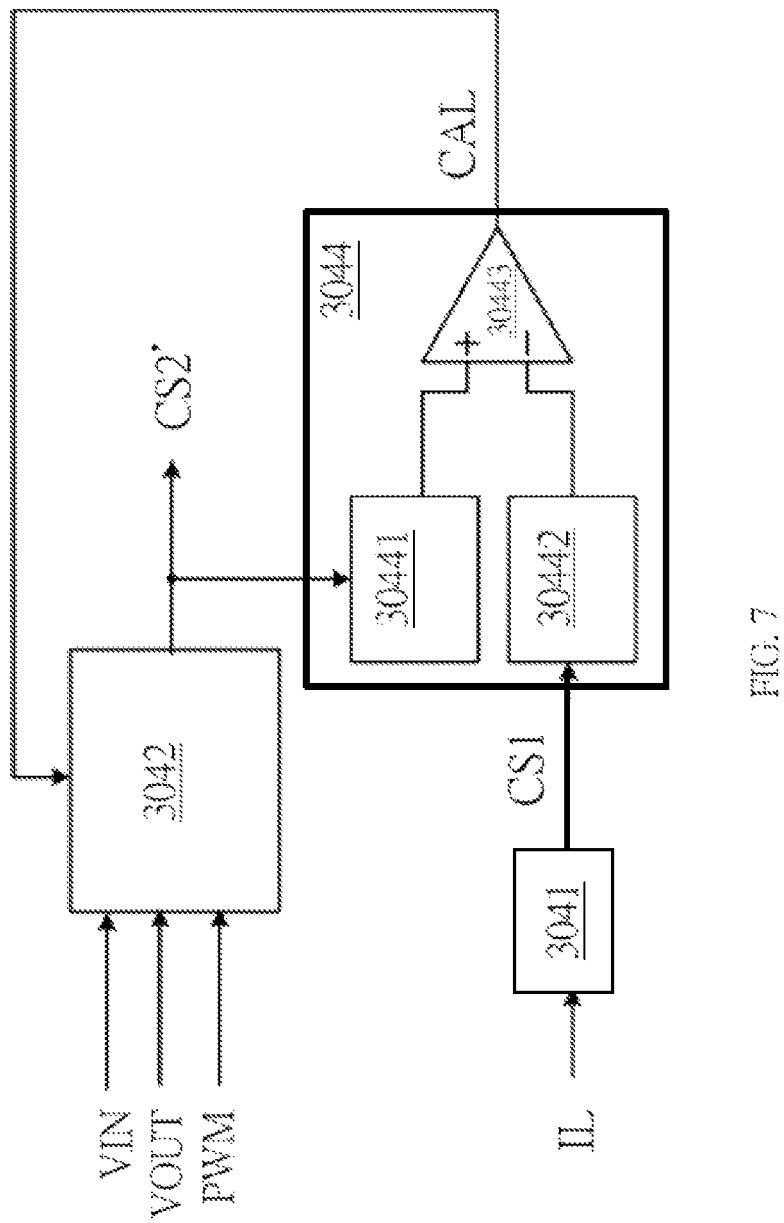
FIG. 7 illustrates a schematic diagram of the calibration circuit.

Please refer to FIG. 7. FIG. 7 illustrates a schematic diagram of the calibration circuit 3044. As shown in FIG. 7, the calibration circuit 3044 includes a first sampling circuit 30441, a second sampling circuit 30442 and a comparator 30443. The first sampling circuit 30441 is coupled to the simulated current generation circuit 3042 and a positive input terminal + of the comparator 30443 and used for sampling the simulated current signal CS2 generated by the simulated current generation circuit 3042 in each period and providing the sampling result to the comparator 30443. The second sampling circuit 30442 is coupled to the current sensing circuit 3041 and a negative input terminal − of the comparator 30443 and used for sampling the actual sensed current signal CS1 provided by the current sensing circuit 3041 in each period and providing the sampling result to the comparator 30443. The comparator 30443 compares the sampling results of the first sampling circuit 30441 and the second sampling circuit 30442 to output the calibration signal CAL to the simulated current generation circuit 3042. The simulated current generation circuit 3042 generates the calibrated simulated current signal CS2' according to the calibration signal CAL.

Figure 8:
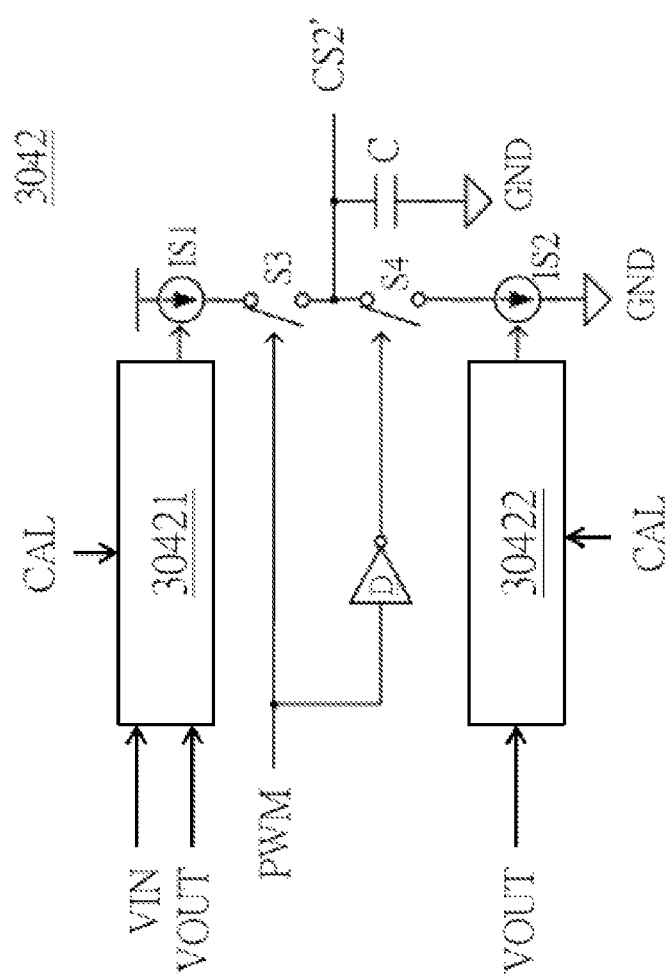
FIG. 8 illustrates a schematic diagram of the simulated current generation circuit.

Please refer to FIG. 8. FIG. 8 illustrates a schematic diagram of the simulated current generation circuit 3042. As shown in FIG. 8, the simulated current generation circuit 3042 includes current source control circuits 30421~30422, current sources IS1~IS2 and switches S3~S4. The switch S3, the switch S4 and the current source IS2 are coupled in series between the current source IS1 and the ground terminal GND. The current sources IS1~IS2 are controlled by the current source control circuits 30421~30422 respectively. The switches S3~S4 are controlled by the pulse-width modulation signal PWM and its inversion signal respectively. The current source control circuits 30421~30422 perform voltage-to-current conversion on the input voltage VIN-output voltage VOUT and the output voltage VOUT respectively to generate rising/pulling waveform, and adjust the voltage multiplier according to the calibration signal CAL to change the slope of the rising/pulling waveform to adjust the magnitudes of the currents provided by the current sources IS1~IS2, thereby generating the calibrated simulated current signal CS2'.

Figure 2:
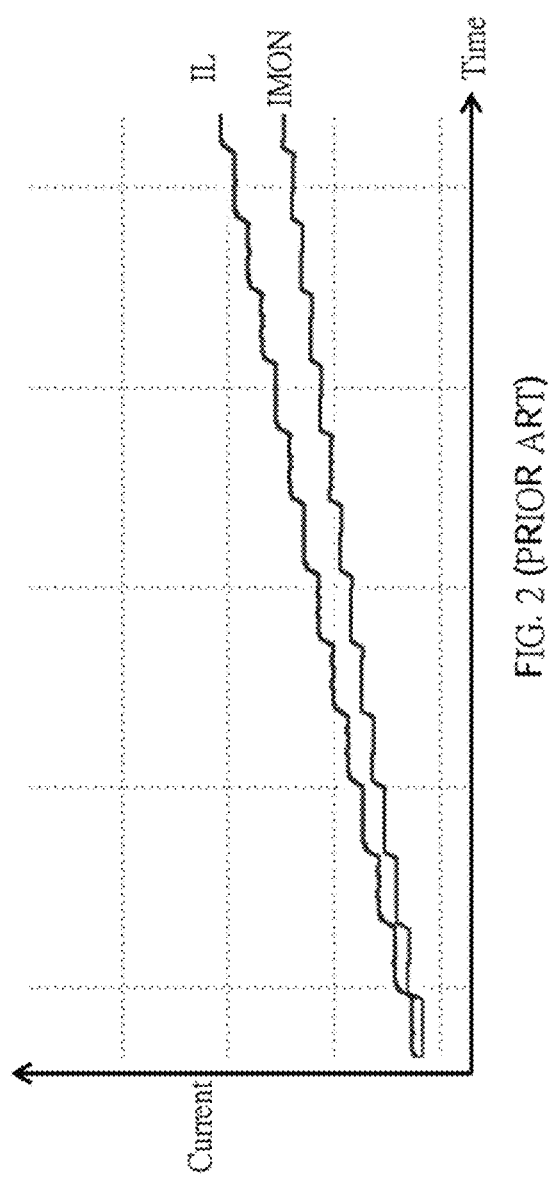
FIG. 2 illustrates a schematic diagram of the error of the conventional current monitoring signal deviating from the output current it represents continuing to accumulate when the transient state lasts for several switching periods.
Figure 9:
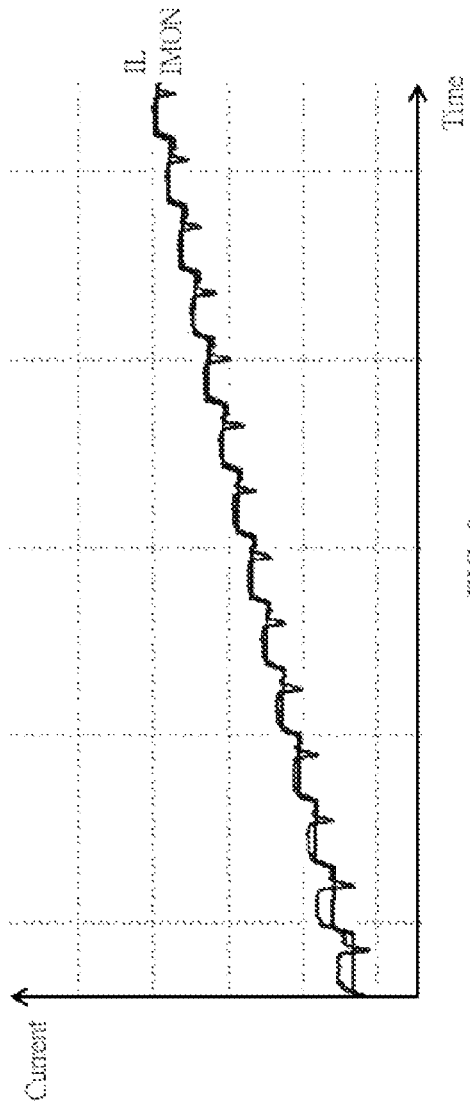
FIG. 9 illustrates a schematic diagram of the current monitoring signal of the invention remaining fairly close to the output current it represents when the transient state lasts for several switching periods.

Please refer to FIG. 9. When the transient state lasts for several switching periods, the current monitoring signal IMON provided by the smart power stage module 3 of the invention can still continue to maintain a relatively close to the output current IL it represents, so the problem of continuous accumulation of the error of the current monitoring signal IMON deviating from the output current IL represented by the current monitoring signal IMON in the prior art shown in FIG. 2 can be effectively improved.

Another embodiment of the invention is a current monitoring signal generation circuit. Please refer to FIG. 3 and FIG. 6. A current monitoring signal generation circuit 300 is coupled to an output stage 32. The output stage 32 includes a low-side switch LS and generates an output current IL according to a pulse-width modulation signal PWM. The pulse-width modulation signal PWM includes an on-time period part of the low-side switch LS. The current monitoring signal generation circuit 300 includes a determination circuit 302 and a signal combination circuit 304. The determination circuit 302 generates a control signal SNS/$\overline{SNS}$ according to the pulse-width modulation signal PWM. The signal combination circuit 304 is coupled to the determination circuit 302 and the output stage 32 to provide a current monitoring signal IMON representing the output current IL. The current monitoring signal IMON is a combination of the simulated current signal CS2 and the actual sensed current signal CS1. The signal combination circuit 304 includes a switching circuit 3043 for switching according to the control signal SNS/$\overline{SNS}$ to adjust a proportion of the simulated current signal CS2 to the actual sensed current signal CS1. When the on-time period part of the low-side switch LS is shorter than a default time period, the switching circuit 3043 shortens a duration of the simulated current signal CS2 in the current monitoring signal IMON according to the control signal SNS/$\overline{SNS}$. As for the detailed operation of the current monitoring signal generation circuit 300 in this embodiment, please refer to the related descriptions in the foregoing description and drawings, and it will not be repeated here.

Figure 10:
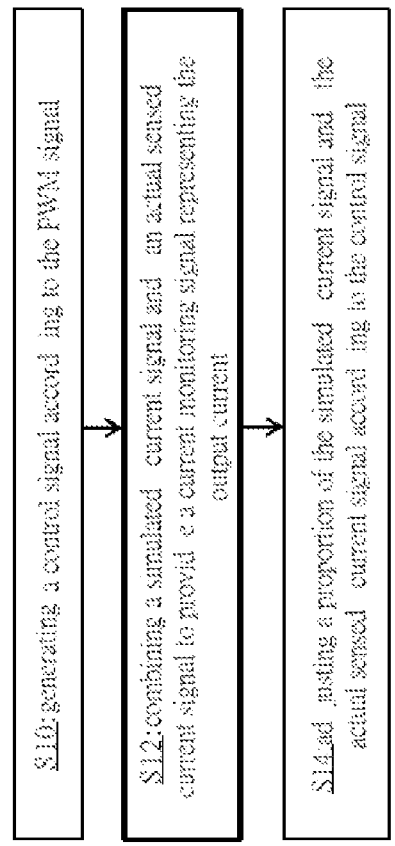
FIG. 10 illustrates a flowchart of the current monitoring signal generation method in another embodiment of the invention.

Another embodiment of the invention is a method for generating a current monitoring signal. In this embodiment, the method is applied to a smart power stage module. The smart power stage module includes an output stage. The output stage includes a low-side switch and provides an output current according to a PWM signal. The PWM signal includes an on-time period part of the low-side switch. Please refer to FIG. 10. FIG. 10 illustrates a flowchart of the current monitoring signal generation method in this embodiment.

As shown in FIG. 10, the current monitoring signal generation method includes the following steps:

Step S10: generating a control signal according to the PWM signal;

Step S12: combining a simulated current signal and an actual sensed current signal to provide a current monitoring signal representing the output current; and Step S14: adjusting a proportion of the simulated current signal and the actual sensed current signal according to the control signal.

When the on-time period part of the low-side switch in the PWM signal is shorter than a default time period, Step S14 will shorten a duration of the simulated current signal in the current monitoring signal according to the control signal; that is to say, the current monitoring signal will be earlier switched from the simulated current signal to the actual sensed current signal.

In an embodiment, Step S12 can further calibrate the simulated current signal according to a difference between the actual sensed current signal and the simulated current signal to generate a calibrated simulated current signal, but not limited to this.

In another embodiment, Step S10 can further include: sampling the PWM signal at a first time period counted from a falling edge of the PWM signal to obtain a first sampling result; sampling the PWM signal at a second time period counted from the falling edge of the PWM signal to obtain a second sampling result, and the second time period is shorter than the first time period; and generating a control signal according to the first sampling result and the second sampling result, but not limited to this.

In another embodiment, when the on-time period part of the low-side switch in the PWM signal is greater than or equal to a default time period, Step S14 will make the duration of the simulated current signal in the current monitoring signal to be a third time period according to the control signal. When the on-time period part of the low-side switch in the PWM signal is shorter than the default time period, Step S14 will make the duration of the simulated current signal in the current monitoring signal to be a fourth time period according to the control signal, and the fourth time period is shorter than the third time period.

Compared to the prior art, the smart power stage module, the current monitoring signal generation circuit and the current monitoring signal generation method of the invention dynamically adjust the time period point of switching the simulated current signal and the actual sensed current signal according to the frequency change of the PWM signal to adjust the proportion of the simulated current signal and the actual sensed current signal in the current monitoring signal, so that the error between the current monitoring signal and the output current represented by the current monitoring signal will not accumulate as the transient state continues, and the accuracy of the current monitoring signal under high-speed switching state can be effectively improved.

What is claimed is:

1. A smart power stage (SPS) module, comprising:
   an output stage, comprising a low-side switch, configured to provide an output current; and
   a driving circuit, coupled to the output stage and configured to control an operation of the output stage according to a pulse-width modulation (PWM) signal, wherein the PWM signal comprises an on-time period part of the low-side switch, and the driving circuit comprises:
      a determination circuit, configured to generate a control signal according to the PWM signal; and
      a signal combination circuit, coupled to the determination circuit and the output stage and configured to provide a current monitoring signal representing the output current, wherein the current monitoring signal is a combination of a simulated current signal and an actual sensed current signal,
   wherein the signal combination circuit comprises a switching circuit configured to switch according to the control signal to adjust a proportion of the simulated current signal and the actual sensed current signal,
   wherein when the on-time period part of the low-side switch is shorter than a default time period, the switching circuit shortens a duration of the simulated current signal in the current monitoring signal according to the control signal;
   wherein the signal combination circuit comprises:
      a current sensing circuit, coupled to the output stage and the switching circuit and configured to sense the output current to provide the actual sensed current signal;
      a simulated current generation circuit, coupled to the switching circuit and configured to provide the simulated current signal related to the output current; and
      a calibration circuit, coupled to the current sensing circuit and the simulated current generation circuit respectively and configured to generate a calibration signal according to a difference between the actual sensed current signal and the simulated current signal to make the simulated current generation circuit to generate a calibrated simulated current signal.

2. The SPS module of claim 1, wherein the determination circuit comprises:
   a first sampling circuit, configured to receive the PWM signal and sample the PWM signal at a first time period counted from a falling edge of the PWM signal to obtain a first sampling result;
   a second sampling circuit, configured to sample the PWM signal at a second time period counted from the falling edge of the PWM signal to obtain a second sampling result, wherein the second time period is shorter than the first time period; and
   a timing control circuit, coupled to the first sampling circuit and the second sampling circuit respectively and configured to generate the control signal according to the first sampling result and the second sampling result.

3. The SPS module of claim 1, wherein the determination circuit send the control signal to control the switching circuit to make the duration of the simulated current signal in the current monitoring signal being a third time period when the on-time period part of the low-side switch longer or equal to the default time period.

4. The SPS module of claim 3, wherein the determination circuit send the control signal to control the switching circuit to make the duration of the simulated current signal in the current monitoring signal being a fourth time period when the on-time period part of the low-side switch shorter than the default time period, and the fourth time period is shorter than the third time period.

5. A current monitoring signal generation circuit, coupled to an output stage of a smart power stage module, the output stage comprising a low-side switch and providing an output current according to a PWM signal, the PWM signal comprising an on-time period part of the low-side switch, and the current monitoring signal generation circuit comprising:
   a determination circuit, configured to generate a control signal according to the PWM signal; and
   a signal combination circuit, coupled to the determination circuit and the output stage and configured to provide a current monitoring signal representing the output current, wherein the current monitoring signal is a combination of a simulated current signal and an actual sensed current signal,
   wherein the signal combination circuit comprises a switching circuit configured to switch according to the control signal to adjust a proportion of the simulated current signal and the actual sensed current signal,
   wherein when the on-time period part of the low-side switch is shorter than a default time period, the switching circuit shortens a duration of the simulated current signal in the current monitoring signal according to the control signal;
   wherein the signal combination circuit comprises:

a current sensing circuit, coupled to the output stage and the switching circuit and configured to sense the output current to provide the actual sensed current signal;

a simulated current generation circuit, coupled to the switching circuit to provide the simulated current signal related to the output current; and a calibration circuit, coupled to the current sensing circuit and the simulated current generation circuit respectively and configured to generate a calibration signal according to a difference between the actual sensed current signal and the simulated current signal to make the simulated current generation circuit to generate a calibrated simulated current signal.

6. A current monitoring signal generation method, applied to a smart power stage module, the smart power stage module comprising an output stage, and the output stage comprising a low-side switch and providing an output current according to a PWM signal, and the PWM signal comprising an on-time period part of the low-side switch, the method comprising:
  (a) generating a control signal according to the PWM signal;
  (b) combining a simulated current signal and an actual sensed current signal to provide a current monitoring signal representing the output current; and
  (c) adjusting a proportion of the simulated current signal and the actual sensed current signal according to the control signal,
  wherein when the on-time period part of the low-side switch is shorter than a default time period, the step (c) shortens a duration of the simulated current signal in the current monitoring signal according to the control signal;
  wherein the step (b) further comprises:
  (b1) calibrating the simulated current signal according to a difference between the actual sensed current signal and the simulated current signal to generate a calibrated simulated current signal;
  wherein the step (a) further comprises:
  (a1) sampling the PWM signal at a first time period counted from a falling edge of the PWM signal to obtain a first sampling result;
  (a2) sampling the PWM signal at a second time period counted from the falling edge of the PWM signal to obtain a second sampling result, and the second time period is shorter than the first time period; and
  (a3) generating the control signal according to the first sampling result and the second sampling result.

7. The method of claim 6, wherein the step (c) makes the duration of the simulated current signal in the current monitoring signal being a third time period according the control signal when the on-time period part of the low-side switch longer or equal to the default time period.

8. The method of claim 6, wherein the step (c) makes the duration of the simulated current signal in the current monitoring signal being a fourth time period according the control signal when the on-time period part of the low-side switch shorter than the default time period, and the fourth time period is shorter than the third time period.

* * * * *